United States Patent [19]
Oyamada et al.

[11] Patent Number: 6,166,905
[45] Date of Patent: Dec. 26, 2000

[54] SEALED TYPE CASING

[75] Inventors: Takashi Oyamada; Yasuo Ueno, both of Tokyo, Japan

[73] Assignee: NEC Corporation, Tokyo, Japan

[21] Appl. No.: 09/333,091

[22] Filed: Jun. 15, 1999

[30] Foreign Application Priority Data

Jun. 17, 1998 [JP] Japan ................... 10-169757

[51] Int. Cl.[7] .................................................. H05K 7/20
[52] U.S. Cl. .......................... 361/697; 165/80.3; 310/64; 417/423.5; 454/184
[58] Field of Search .................................... 415/115, 178; 416/223 R, 189; 417/423.5; 165/80.3, 121–126; 174/15.1, 16.1; 454/184; 361/687, 690, 694, 695, 703, 696, 697; 310/58, 59, 64

[56] References Cited

U.S. PATENT DOCUMENTS

| | | |
|---|---|---|
| 5,445,215 | 8/1995 | Herbert . |
| 5,478,214 | 12/1995 | Howarth . |
| 5,771,961 | 6/1998 | Alizadeh . |
| 6,039,111 | 3/2000 | Kawaguchi . |

FOREIGN PATENT DOCUMENTS 4-32300  2/1992  Japan .

*Primary Examiner*—Gerald Tolin
*Attorney, Agent, or Firm*—Ostrolenk, Faber, Gerb & Soffens, LLP

[57] ABSTRACT

A sealed type casing comprises a casing body 10, a cover 9, one motor 12 fixed to a rear face plate 10a of the casing body, a plurality of inner and outer heat exchange fins 11a, 11b integral with and formed on inner and outer surfaces of the rear face plate so that the heat exchange fins are arranged vortically in an overlapping manner around a rotary shaft 12a of the motor, a first centrifugal fan 13 adapted to be rotated inside the casing body by the motor and sending the air to the inner heat exchange fins, and a second centrifugal fan 13 adapted to be rotated outside the casing body by the motor and sending outside air to the outer heat exchange fins. When the motor is rotated, the centrifugal fans apply a centrifugal force to the air sucked from a region close to the rotary shaft of the motor, and send out the air toward the heat exchange fins.

7 Claims, 6 Drawing Sheets

SEALED TYPE CASING

BACKGROUND OF THE INVENTION

This invention relates to a sealed type casing used for base station equipment for portable telephones and, more particularly to a miniaturized sealed type casing adapted to efficiently radiate the heat generated in the interior thereof.

With the recent advancement of techniques, the miniaturization of a sealed type casing used for base station equipment for portable telephones is progressing year by year. As the miniaturization of the sealed type casing progresses, the quantity of heat generated therein per unit volume of the casing increases, so that a radiating structure more efficient than a conventional structure of this kind is demanded. Simultaneously with the progress of miniaturization of the sealed type casing, the number of the casing installed outdoors increases. Accordingly, the necessity of such a sealed type casing to meet the waterproofing conditions as well is increasing.

A conventional sealed type casing for communication machines and tools is shown in FIGS. 1 and 2. A sealed type casing 20 for communication machines and tools comprises a casing body 21 and a cover 25, and the casing body 21 is fixed to an electric pole by two straps 3. A radiator (heat radiator) 22 made of aluminum is fixed to the casing body 21 by screws 24 via waterproof packings 23, and adapted to radiate the heat occurring in a heating unit 17 provided in the interior of the casing body 21 to the outside thereof. A cable 4 of a power source wire and a communication wire is drawn from a bottom portion of the casing body 21 thereinto.

However, the radiation of heat from the interior to the exterior of the sealed type casing 20 for communication machines and tools is carried out in the form of natural radiation of heat from the casing body 21 and radiator 22, so that a surface area of the casing body 21 is necessarily increased. This necessarily causes the dimensions and weight as well of the casing body 21 to increase. Since the radiation characteristics of the radiator 22 are influenced by an external wind velocity, a radiating effect of the radiator 22 decreases in a windless condition. Since the air is made to flow in a plurality of grooves in the radiator 22 by utilizing a convection current, it is necessary that each groove of the radiator 22 faces in the vertical direction so as to permit the heated air to be discharged from the grooves. This causes inconvenience since the direction in which the sealed type casing 20 for communication machines and tools is fixed to the electric pole 2 is restricted.

Another conventional cooling apparatus for electronic machines and tools is shown in FIG. 3. This cooling apparatus for electronic machines and tools is disclosed in Japanese Unexamined Patent Publication (JP-A) No. 32300/1992. A box type casing 31 for housing various kinds of electronic parts therein is divided into two chambers 33, 34 by a heat insulating partition 32. A first chamber 33 houses therein a control electronic part 41, such as a printed circuit board of a low thermal resistance, and a second chamber 34 houses therein an electronic part 42, which has a large quantity of generated heat, for a main circuit. Therefore, a fan 43 for agitating the air in the interior of the second chamber 34 is provided therein, and a cooling member 44, such as a radiating fin is also provided on an outer surface of the electronic part 42 for a main circuit.

However, in this cooling apparatus for electronic machines and tools, the control electronic part 41 generally has a low thermal resistance, so that it is necessary to increase a surface area of the box type casing 31 for increasing the cooling effect. The greater part of the generated heat in the interior of the box type casing 31 is caused by the electronic part 42 for a main circuit. The greater part of the generated heat in the electronic part 42 for a main circuit is radiated from the cooling member 44 but a part thereof is radiated with the generated heat of the control electronic part 41 from an outer surface of the box type casing 31. The control electronic part 41 is influenced by the generated heat of the electronic part 42 for a main circuit. Since the fan 43 and cooling member 44, such as a radiating fin are used in the cooling apparatus for electronic machines and tools, the miniaturization of the apparatus as a whole and the simplification of the construction thereof have not yet been attained.

SUMMARY OF THE INVENTION

Therefore, an object of the present invention is to provide a sealed type casing capable of improving a rate of discharging the heat generated in the interior of the casing.

Another object of the present invention is to provide a sealed type casing of small dimensions which is not restricted in place for installation thereof.

According to the present invention, a sealed type casing is provided which comprises a casing body, a cover, a motor fixed to a face plate of the casing body, a plurality of inner and outer heat exchange fins integral with and formed on inner and outer surfaces of the face plate so that the heat exchange fins are arranged vortically in an overlapping manner around a rotary shaft of the motor, a first centrifugal fan adapted to be rotated inside the casing body by the motor and sending the air to the inner heat exchange fins, and a second centrifugal fan adapted to be rotated outside the casing body by the motor and sending outside air to the outer heat exchange fins.

PREFERRED EMBODIMENT OF THE PRESENT INVENTION

The sealed type casing for communication machines and tools of an embodiment of the present invention will now be described with reference to FIGS. 4–7.

Figure 1:
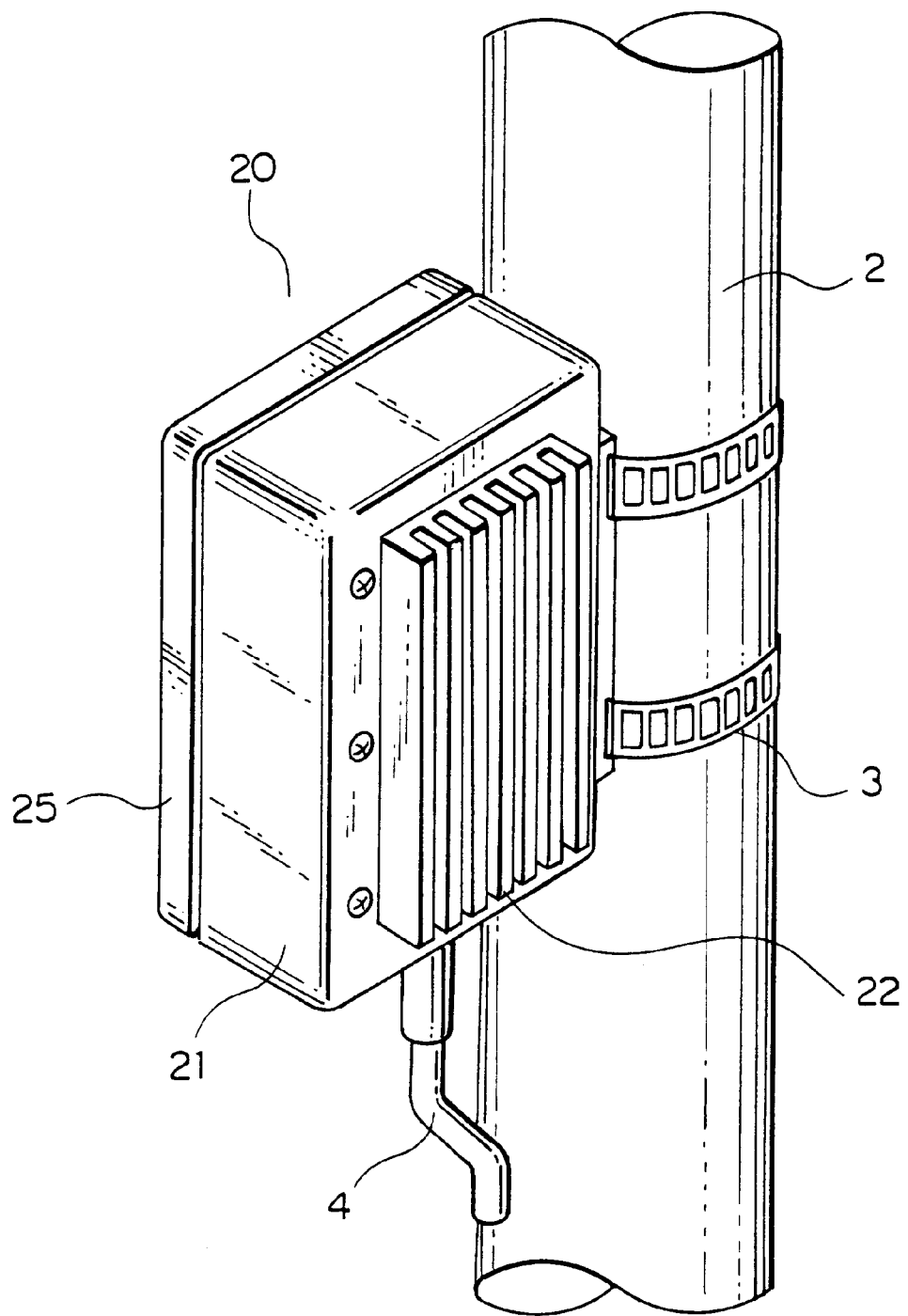
FIG. 1 is a perspective view of a conventional sealed type casing for communication machines and tools, fixed to an electric pole.
Figure 2:
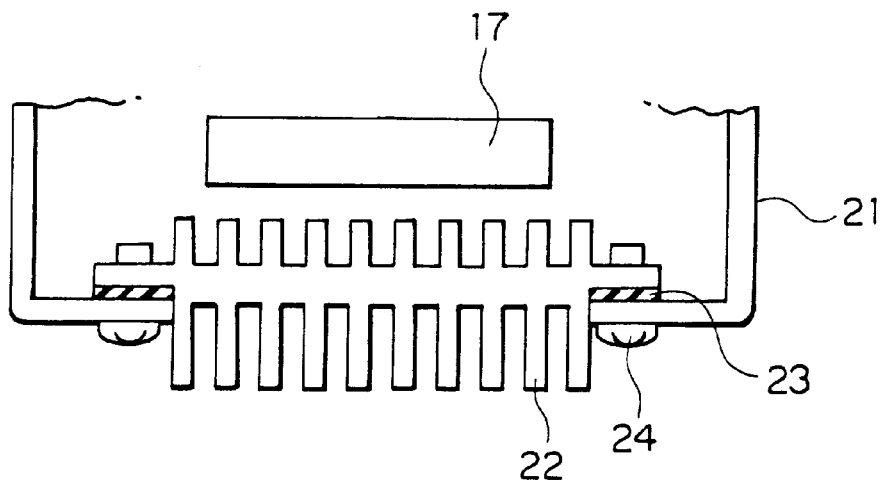
FIG. 2 is a sectional view of a principal portion of the conventional sealed type casing for communication machines and tools.
Figure 3:
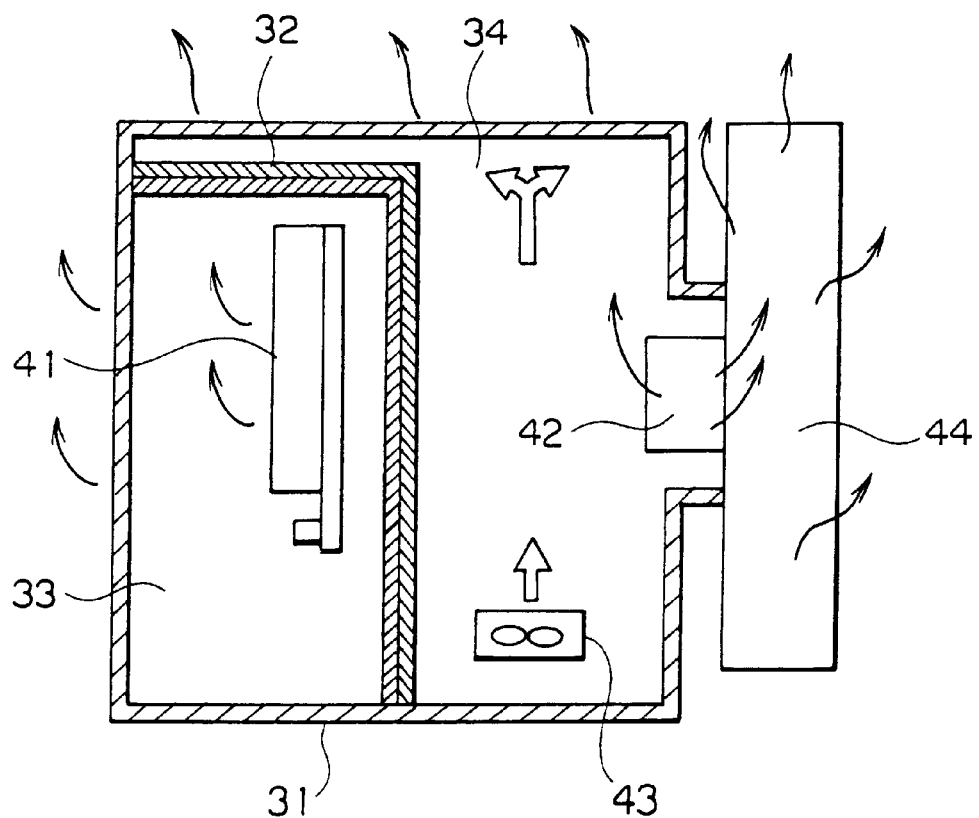
FIG. 3 is a sectional view of a conventional cooling unit for electronic machines and tools.
Figure 4:
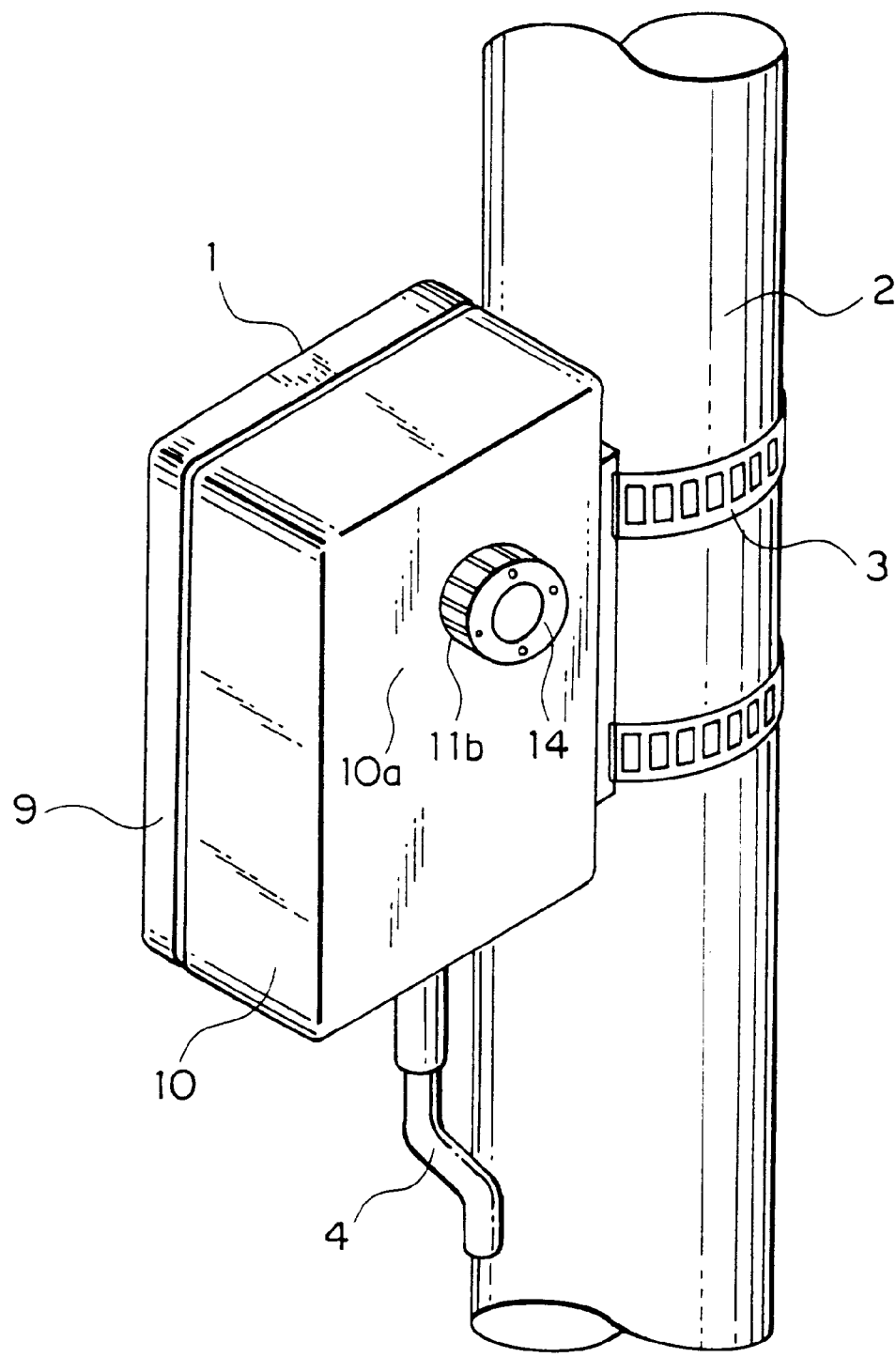
FIG. 4 is a perspective view of the sealed type casing for communication machines and tools of an embodiment of the present invention, fixed to an electric pole.

As shown in FIG. 4, a sealed type casing 1 for communication machines and tools comprises a casing body 10 and a cover 9 which are formed out of a metal or a synthetic resin, and the casing body 10 is fixed to an electric pole 2 by two straps 3. A cable 4 of a power source wire and a communication wire is drawn from a bottom portion of the casing body 10 thereinto. A plurality of outer heat exchange fins 11b and one outer plate 14 are provided in an exposed state on a rear face plate 10a of the casing body 10.

Figure 5:
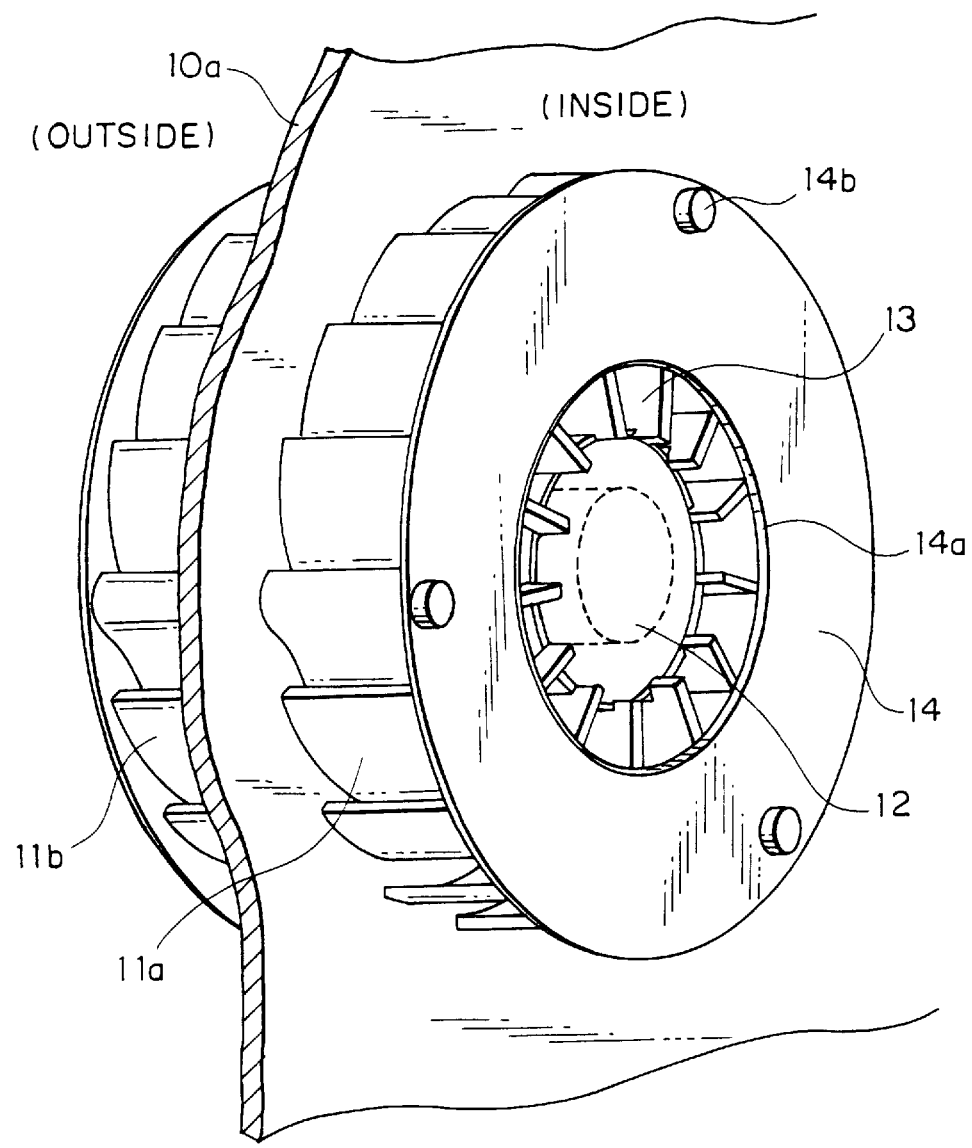
FIG. 5 is an enlarged perspective view of a principal portion of the sealed type casing for communication machines and tools of an embodiment of the present invention.
Figure 6:
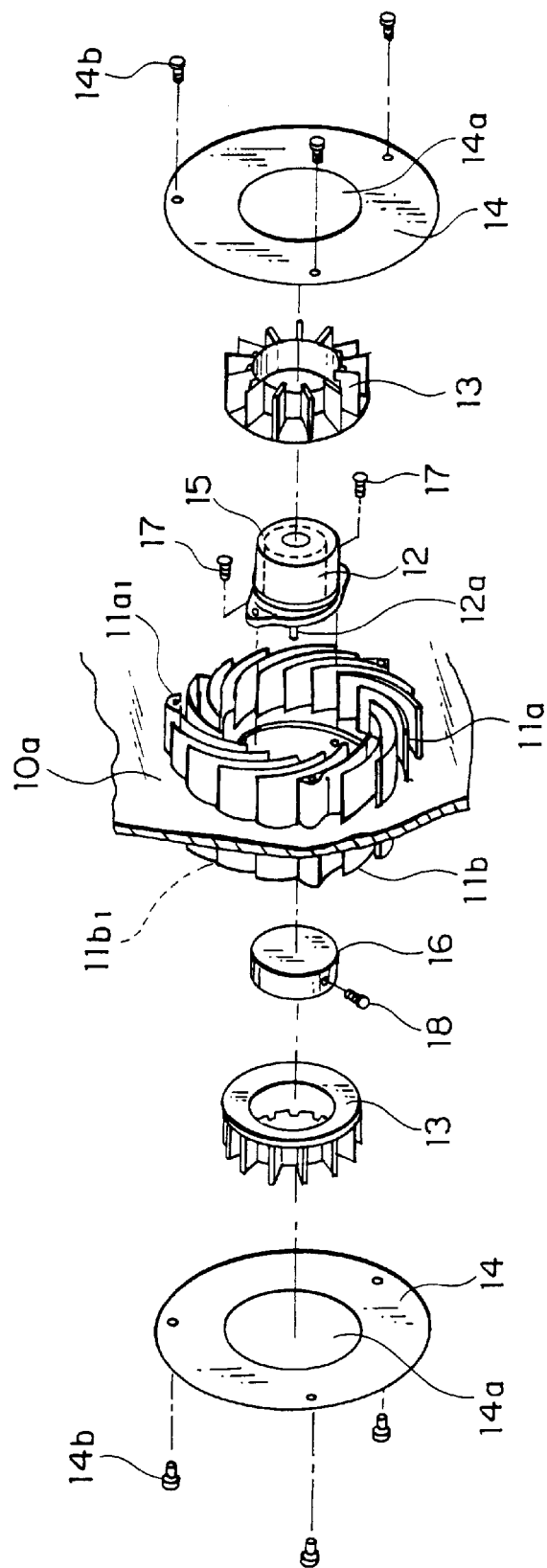
FIG. 6 is an exploded perspective view of a principal portion of the sealed type casing for communication machines and tools of an embodiment of the present invention.
Figure 7:
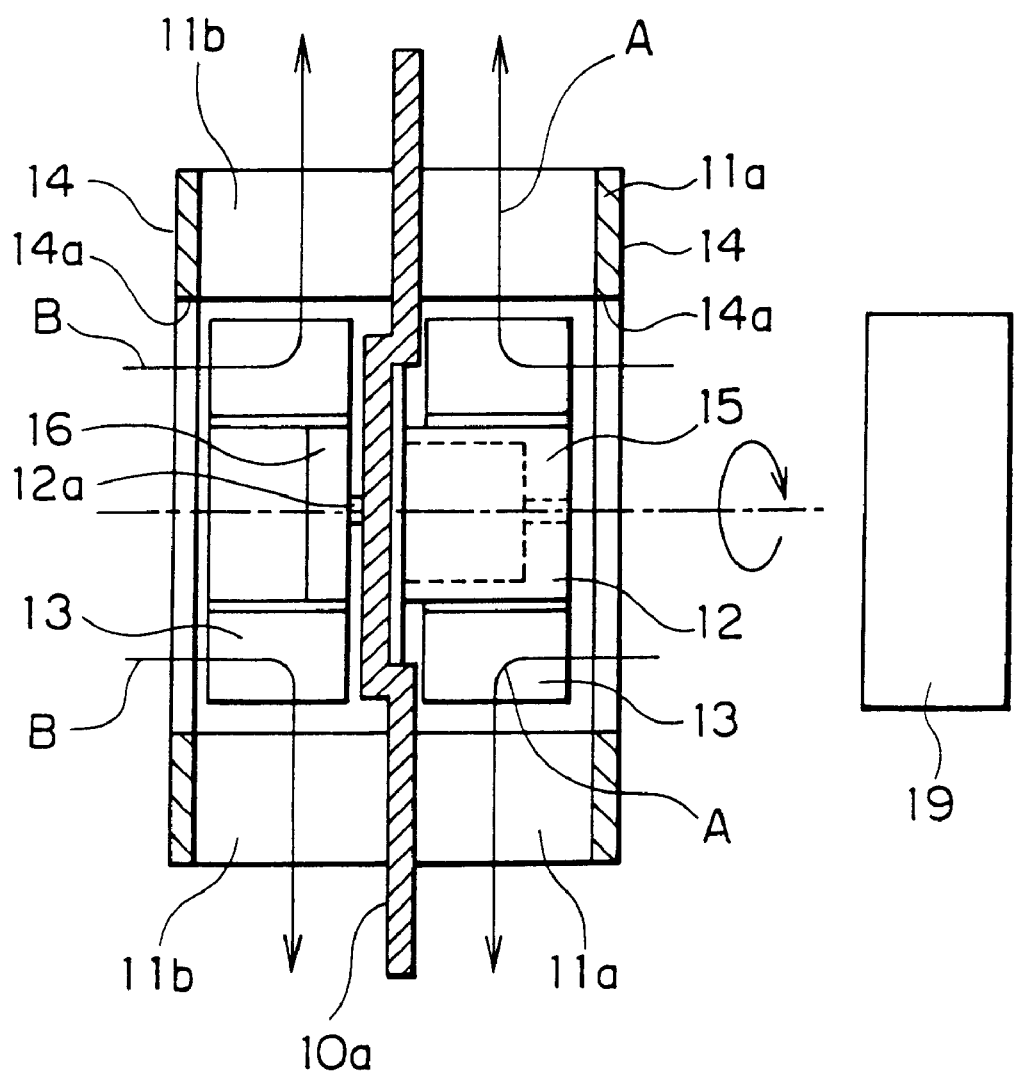
FIG. 7 is an enlarged sectional view of a principal portion of the sealed type casing for communication machines and tools of an embodiment of the present invention.

An enlarged perspective view, an exploded perspective view and an enlarged sectional view of a principal portion of the sealed type casing for communication machines and tools are shown in FIGS. 5, 6, 7 respectively.

A rear face plate 10a of the casing body 10 is provided on the inner and outer sides thereof with a plurality of vortically arranged heat exchange fins 11a, 11b. A motor 12 is fixed to a central portion of the rear face plate 10a of the casing body 10 by a pair of screws 17.

On the outer side of the rear face plate 10a of the casing body 10, a bush 16 is fixed to a rotary shaft 12a of the motor 12 by a screw 18, and an outer centrifugal fan 13 is press fitted around the bush 16.

The motor 12 is a known outer rotor type motor, and an inner centrifugal fan 13 is press fitted around the outer rotor 15 by utilizing the outer rotor 15 as a fan adapter. Namely, a centrifugal fan 13 is fixed to both sides respectively of one motor 12.

In this embodiment, the motor 12 is stored in the interior of the sealed type casing, and the rotary shaft 12a alone projects to the outside. Accordingly, the sealed type casing is easily formed to have a waterproof structure, and the reliability of installing the same outdoors is high. Furthermore, since the bush 16 is formed to have the same diameter as the outer rotor 15, two identical centrifugal fans 13 can be used. Therefore, only one expensive motor is required to meet the purpose, and a great cost reducing effect is obtained.

The heat exchange fins 11a, 11b are formed in an overlapping manner by die casting or by a synthetic resin molding process so that they become integral with the inner and outer surfaces respectively of the rear face plate 10a of the casing body 10. The heat exchange fins comprise arcuately bent plate members arranged vortically and erected in a direction in which the air sent by the centrifugal fans 13 flows, in such a manner that one end portion of each of the fins extends toward the center of the vortically arranged fins with the other end portion of each thereof extending toward an outer circumference thereof.

When the heat exchange fins are molded out of a synthetic resin, it is preferable that the synthetic resin is used in which metal fibers comprising finely pulverized copper or aluminum are mixed so as to improve the thermal conductivity thereof.

The sides of the heat exchange fins 11a, 11b which are opposite to those thereof which are made integral with the rear face plate 10a are covered with disc type plates 14 having openings 14a in the central portions thereof. The plates 14 are fixed by driving three screws 14b into relative screw holes 11a1, 11b1 provided in three heat exchange fins out of relative set of heat exchange fins 11a, 11b. The plate 14, heat exchange fins 11a, 11b and inner and outer surfaces of the rear face plate 10a define air passages, and the air sent into the interior of the heat exchange fins 11a, 11b by the centrifugal fans 13 passes through the air passages with the air neither diffused nor inversely moved.

Since the plates 14 can be fixed to and removed from the heat exchange fins 11a, 11b by driving and extracting the screws 14b thereinto and therefrom, the air passages among the outer heat exchange fins 11b can be cleaned easily during a periodical inspection of the casing.

The operation of this embodiment will now be described. When the motor 12 is rotated, the centrifugal fans 13 apply a centrifugal force to the air sucked from a region close to the axis of the motor 12, and send out the air toward the heat exchange fins 11a, 11b. Since the heat exchange fins 11a, 11b are covered with the plates 14 and the inner and outer surfaces of the rear face plate 10a, the air sent thereinto flows toward the circumferences of the sets of heat exchange fins along each heat exchange fin 11a, 11b with the air neither diffused nor inversely moved. The flow of the air will be described in detail later.

The inside air heated with a heating unit 19 in the casing body 10 flows in the direction of arrows A and is circulated between the casing body 10 and heat exchange fins 11a. During this time, the heat of the air in the casing body 10 is transmitted to the heat exchange fins 11a and then to the heat exchange fins 11b via the rear face plate 10a. The outer centrifugal fan 13 sucks the outside air from a region close to the rotary shaft of the motor 12 and discharges it along the centrifugal fins 11b as shown by arrows B. During this time, the heat of the air in the casing body 10 and that of the outside air are exchanged via the heat exchange fins 11a, 11b. A heat exchange amount is proportioned to a flow rate of the air and a heating surface area. Since a transfer pressure of the air can be heightened owing to the use of the centrifugal fans 13, a powerful flow of the air offsetting a pressure loss occurring when the air passes through the narrow spaces among the heat exchange fins 11a, 11b can be formed. When a heat transfer surface area of the heat exchange fins 11a, 11b as a whole is increased by increasing the area thereof by bending the fins, and by increasing the number thereof, a heat exchange amount increases.

As described above, the heat occurring in the heating unit 19 in the casing body 10 is discharged to the outside thereof owing to the convection of the air in the casing body 10, heat conduction of the heat exchange fins 11a, heat conduction of the rear face plate 10a, heat conduction of the heat exchange fins 11b and convection of the outside air. In order to increase the heat exchange capacity, it is desirable that a radiating surface area, i.e. an area of surfaces which the air in the casing body 10 contacts is increased.

In this mode of embodiment, the heat exchange fins 11a, 11b are provided on one portion only of the rear face plate 10a. When they are provided on a plurality of portions of the rear face plate 10a, a radiating effect can be improved.

As is clear from the above description, the present invention can display the following effects.

1. Since the heat exchange fins are provided so as to become integral with the body of the sealed type casing, the weight of the casing decreases, and this contributes to the miniaturization of the casing. Furthermore, the manufacturing cost becomes low, and the number of assembling steps decreases.

2. Since the heat exchange fins and casing body are made integral, it is unnecessary to provide waterproof packings therebetween, and the waterproofing characteristic of the casing is improved.

3. Since the centrifugal fans cause the convection of the air to occur inside and outside of the casing body, the heat generated in the interior of the casing body can be radiated with a high efficiency.

4. Since the interior of the sealed type casing is cooled without replacing the inside and outside air with each other, the dust, noxious substances (for example, conductive metal powder, salt and sulfur dioxide) and rainwater which are contained in the outside air do not enter the interior of the sealed type casing. This enables communication machines and tools to be installed in a desired place.

What is claimed is:

1. A sealed type casing comprising a casing body, a cover, a motor fixed to a face plate of said casing body, a plurality of inner and outer heat exchange fins integral with and formed on inner and outer surfaces of said face plate so that said heat exchange fins are arranged vortically in an overlapping manner around a rotary shaft of said motor, a first centrifugal fan adapted to be rotated inside said casing by said motor and sending the air to said inner heat exchange fins, and a second centrifugal fan adapted to be rotated outside said casing body by said motor and sending outside air to said outer heat exchange fins.

2. A sealed type casing as claimed in claim 1, wherein said casing body and said heat exchange fins are manufactured by die casting.

3. A sealed type casing as claimed in claim 1, wherein said casing body and said heat exchange fins are molded out of a synthetic resin.

4. A sealed type casing as claimed in claim 1, wherein one of said two centrifugal fans is press fitted around a bush fixed to said rotary shaft of said motor, the other centrifugal fan being press fitted around an outer rotor of said motor.

5. A sealed type casing as claimed in claim 1, wherein the sides of said inner and outer heat exchange fins which are opposite to those thereof which are made integral with said face plate is covered with disc type plates having openings in central portions thereof.

6. A sealed type casing as claimed in claim 5, wherein said plates are fixed to a plurality of heat exchange fins out of said inner and outer heat exchange fins.

7. A sealed type casing as claimed in claim 1, further including a heating unit located within said casing body and generating heat which is dissipated by said heat exchange fins.

* * * * *